US011984302B2

(12) United States Patent
Konnoth Joseph et al.

(10) Patent No.: US 11,984,302 B2
(45) Date of Patent: May 14, 2024

(54) MAGNETIC-MATERIAL SHIELD AROUND PLASMA CHAMBERS NEAR PEDESTAL

(71) Applicant: Applied Materials, Inc., Santa Clara, CA (US)

(72) Inventors: Job George Konnoth Joseph, Kerala (IN); Sathya Swaroop Ganta, Sunnyvale, CA (US); Kallol Bera, Fremont, CA (US); Andrew Nguyen, San Jose, CA (US); Jay D. Pinson, II, San Jose, CA (US); Akshay Dhanakshirur, Hubli (IN); Kaushik Comandoor Alayavalli, Sunnyvale, CA (US); Canfeng Lai, Fremont, CA (US); Ren-Guan Duan, Fremont, CA (US); Jennifer Y. Sun, Mountain View, CA (US); Anil Kumar Kalal, Bengaluru (IN); Abhishek Pandey, Buxar (IN)

(73) Assignee: Applied Materials, Inc., Santa Clara, CA (US)

( * ) Notice: Subject to any disclaimer, the term of this patent is extended or adjusted under 35 U.S.C. 154(b) by 473 days.

(21) Appl. No.: 17/088,407

(22) Filed: Nov. 3, 2020

(65) Prior Publication Data

US 2022/0139679 A1 May 5, 2022

(51) Int. Cl.
*H01J 37/32* (2006.01)
*H01J 37/20* (2006.01)

(52) U.S. Cl.
CPC ........ *H01J 37/32669* (2013.01); *H01J 37/20* (2013.01); *H01J 2237/0264* (2013.01)

(58) Field of Classification Search
CPC .......... H01J 37/32477; H01J 37/32669; H01J 37/32862; H01J 37/32926
See application file for complete search history.

(56) References Cited

U.S. PATENT DOCUMENTS

| 5,444,207 A | 8/1995 | Sekine et al. |
|---|---|---|
| 5,449,977 A | 9/1995 | Nakagawa et al. |
| 6,190,495 B1 | 2/2001 | Kubota et al. |
| 6,436,230 B1 | 8/2002 | Kondo et al. |
| 7,294,224 B2 | 11/2007 | Vesci et al. |
| 9,978,570 B2 | 5/2018 | Zhang et al. |
| 2001/0032590 A1 | 10/2001 | Carducci et al. |
| 2008/0142359 A1* | 6/2008 | Gopalraja ........... H01J 37/3455 204/298.16 |

(Continued)

FOREIGN PATENT DOCUMENTS

| EP | 0867913 | 9/1998 |
|---|---|---|
| JP | 2015084307 | 4/2015 |

OTHER PUBLICATIONS

International Search Report and Written Opinion dated Feb. 21, 2022 for Application No. PCT/US2021/057195.

*Primary Examiner* — Tung X Le
(74) *Attorney, Agent, or Firm* — Patterson + Sheridan, LLP

(57) ABSTRACT

A plasma chamber includes a chamber body having a processing region therewithin, a liner disposed on the chamber body, the liner surrounding the processing region, a substrate support disposed within the liner, a magnet assembly comprising a plurality of magnets disposed around the liner, and a magnetic-material shield disposed around the liner, the magnetic-material shield encapsulating the processing region near the substrate support.

16 Claims, 4 Drawing Sheets

(56) References Cited

U.S. PATENT DOCUMENTS

| | | | |
|---|---|---|---|
| 2011/0234100 A1* | 9/2011 | Tomita | H01J 37/32183 |
| | | | 315/111.21 |
| 2014/0209244 A1* | 7/2014 | Banna | H01J 37/321 |
| | | | 156/345.49 |
| 2014/0251789 A1 | 9/2014 | Miller | |
| 2015/0075981 A1* | 3/2015 | Kuo | H01J 37/3447 |
| | | | 204/298.22 |
| 2015/0200081 A1* | 7/2015 | Nakayama | H01J 37/3405 |
| | | | 134/1.1 |
| 2016/0293389 A1* | 10/2016 | Chen | H01J 37/32293 |
| 2018/0174806 A1 | 6/2018 | Nagaseki et al. | |

* cited by examiner

MAGNETIC-MATERIAL SHIELD AROUND PLASMA CHAMBERS NEAR PEDESTAL

BACKGROUND

Field

Embodiments of the present disclosure generally relate to semiconductor processing equipment, and more specifically to a high permeability magnetic-material shield placed around a plasma chamber encapsulating a processing region near a substrate support disposed within the plasma chamber for adjusting plasma density profile in the processing region.

Description of the Related Art

In low-pressure plasma processing of a substrate, such as plasma enhanced chemical vapor deposition (PECVD), assemblies of permanent magnets are used to control plasma density profile and enhance average plasma density through confinement of the plasma in a plasma chamber, leading to enhancement of uniformity of deposition and deposition rate of materials. Conventionally, the assemblies of permanent magnets are housed within a shield at a fixed position to shield the magnetic field generated within the chamber from sensitive equipment or an adjacent chamber exterior to the chamber. However, the magnetic field generated by the assemblies of permanent magnets disposed at a fixed position may not be well adjusted, and thus the plasma density profile may not be adjusted for even more enhanced uniformity of deposition and deposition rate of materials.

Thus, there is a need for an improved system that allows adjustment of the magnetic field profile in a processing region of a plasma chamber while preventing the magnetic field within the chamber from leaking outside of the chamber to avoid interaction with an adjacent chamber.

SUMMARY

Embodiments of the present disclosure provide a plasma chamber. The plasma chamber includes a chamber body having a processing region therewithin, a liner disposed on the chamber body, the liner surrounding the processing region, a substrate support disposed within the liner, a magnet assembly comprising a plurality of magnets disposed around the liner, and a magnetic-material shield disposed around the liner, the magnetic-material shield encapsulating the processing region near the substrate support.

Embodiments of the present disclosure also provide a shield for use in a plasma chamber. The shield includes a high permeability magnetic material having a relative permeability of 50,000 or more. The high permeability magnetic material is configured to be positioned around a liner disposed within a chamber body of a plasma chamber, and the high permeability magnetic material is configured to encapsulate a processing region of the plasma chamber.

Embodiments of the present disclosure further provide a process chamber. The process chamber includes a lid assembly, a chamber body coupled to the lid assembly by a spacer, the spacer and the chamber body defining a processing region, a rotatable magnet assembly coupled to the spacer outside of the processing region, a substrate support disposed and movable within the processing region. The substrate support is coupled to an actuator configured to raise and lower the substrate assembly, and a magnetic-material shield disposed around the spacer, the magnetic-material shield encapsulating the processing region near the substrate support.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to semiconductor processing equipment, and more specifically to a high permeability magnetic-material shield placed around a plasma chamber encapsulating a processing region near a substrate support disposed within the plasma chamber. In low-pressure plasma processing of a substrate, such as plasma enhanced chemical vapor deposition (PECVD), assemblies of permanent magnets housed on a chamber body are used to control the plasma density profile and enhance the average plasma density through confinement of the plasma in the plasma chamber, leading to enhancement of the uniformity of deposition and the deposition rate of materials. The embodiments described herein provide a magnetic-material shield placed around a plasma chamber encapsulating a processing region near a substrate support disposed within the plasma chamber, which can adjust the magnetic field profile, and thus the plasma density profile, in the processing region to achieve enhanced uniformity of deposition and deposition rate of materials.

Figure 1A:
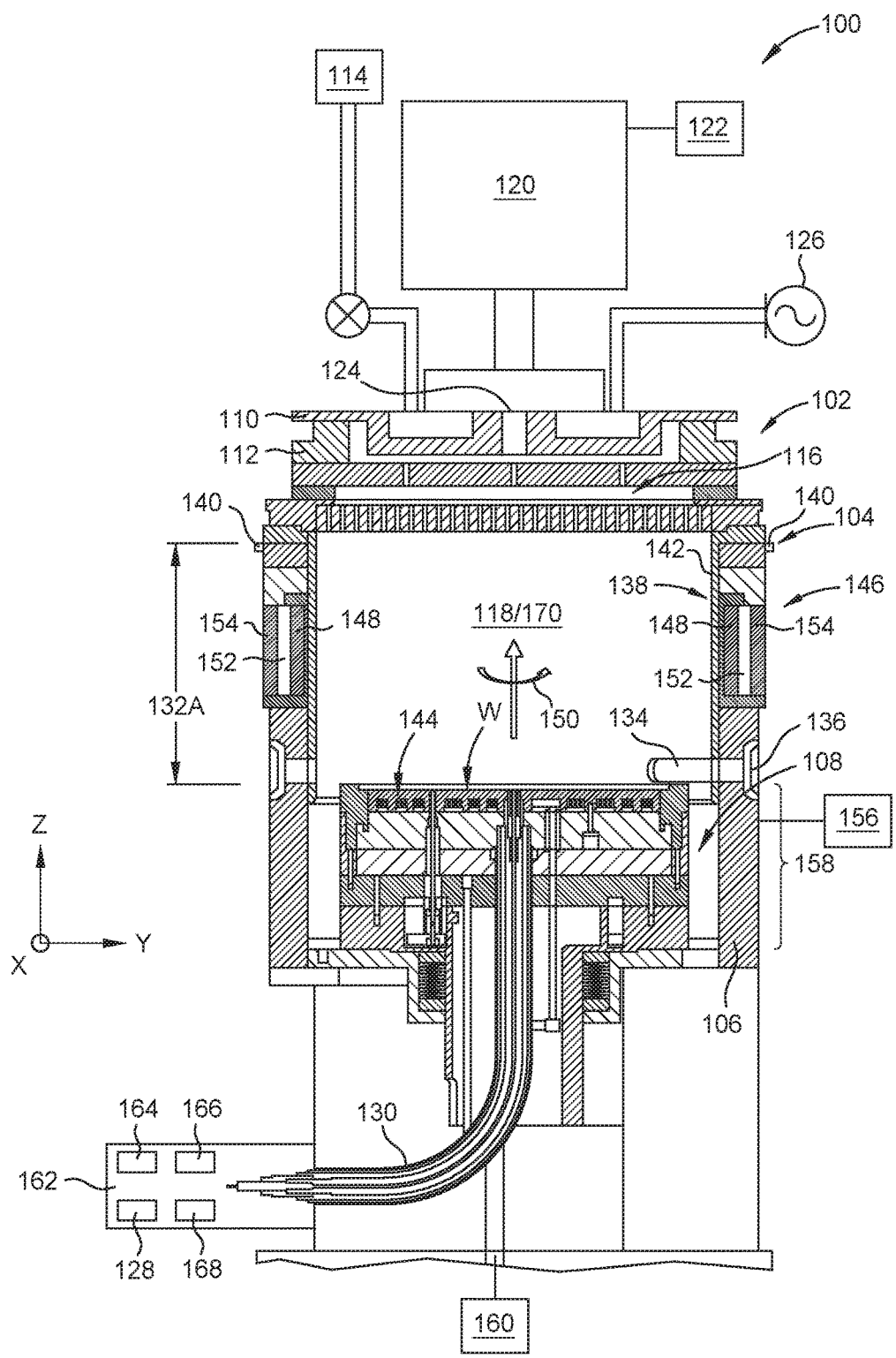
FIGS. 1A and 1B are schematic cross-sectional views of an illustrative processing chamber according to an embodiment.
Figure 1B:
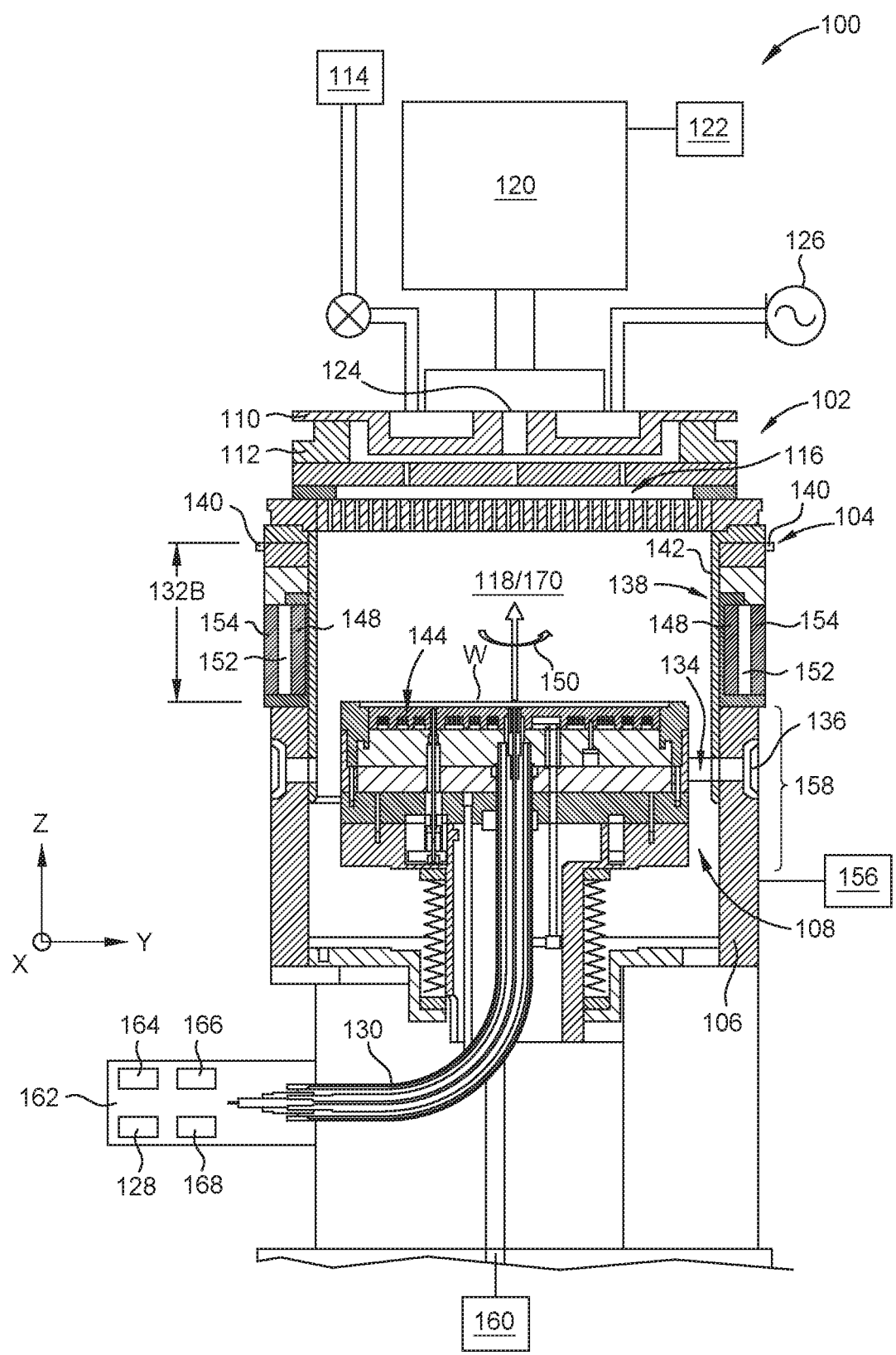

FIGS. 1A and 1B are schematic cross-sectional views of an illustrative processing chamber 100 suitable for conducting a deposition process.

The processing chamber 100 includes a lid assembly 102, a spacer 104 disposed on a chamber body 106, and a substrate support 108. The lid assembly 102 includes a face plate 110 and a heat exchanger 112. The chamber body 106 is coupled to the lid assembly 102 by the spacer 104.

The lid assembly 102 is coupled to a processing gas source 114. The processing gas source 114 contains precursor gases for forming films on a substrate W supported on the substrate support 108. The processing gas source 114 provides precursor gases to a plenum 116 disposed in the lid assembly 102. The lid assembly 102 includes one or more channels for directing precursor gases from the processing gas source 114 into the plenum 116. From the plenum 116, the precursor gases flow into a processing region 118. In some embodiments, another processing gas source (not shown) is fluidly coupled to the processing region 118 via an inlet (not shown) disposed through the spacer 104.

The lid assembly 102 is also coupled to an optional remote plasma source 120. The remote plasma source 120 is coupled to a cleaning gas source 122 for providing cleaning gases to the processing region 118 formed inside the spacer 104 between the lid assembly 102 and the substrate W. In one example, cleaning gases are provided through a central conduit 124 formed axially through the lid assembly 102. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the remote plasma source 120, the lid assembly 102 is also coupled to a first radio frequency (RF) power source 126. The first RF power source 126 facilitates maintenance or generation of plasma, such as a plasma generated from a cleaning gas. In one example, the remote plasma source 120 is omitted, and the cleaning gas is ionized into a plasma in situ via the first RF power source 126. The substrate support 108 is coupled to a second RF power source 128. The first RF power source 126 may be a high frequency RF power source (for example, about 13.56 MHz to about 120 MHz) and the second RF power source 128 may be a low frequency RF power source (for example, about 2 MHz to about 13.56 MHz). It is to be noted that other frequencies are also contemplated. In some implementations, the second RF power source 128 is a mixed frequency RF power source, providing both high frequency and low frequency power. Utilization of a dual frequency RF power source, particularly for the second RF power source 128, improves film deposition. In one example, utilizing the second RF power source 128 provides dual frequency powers. A first frequency of about 2 MHz to about 13.56 MHz improves implantation of species into the deposited film, while a second frequency of about 13.56 MHz to about 120 MHz increases ionization and deposition rate of the film.

One or both of the first RF power source 126 and the second RF power source 128 are utilized in creating or maintaining a plasma in the processing region 118. For example, the second RF power source 128 may be utilized during a deposition process and the first RF power source 126 may be utilized during a cleaning process (alone or in conjunction with the remote plasma source 120). In some deposition processes, the first RF power source 126 is used in conjunction with the second RF power source 128. During a deposition or etch process, one or both of the first RF power source 126 and the second RF power source 128 provide a power of about 100 Watts (W) to about 20,000 W in the processing region 118 to facilitation ionization of a precursor gas. In some embodiments, at least one of the first RF power source 126 and the second RF power source 128 are pulsed.

The substrate support 108 is coupled to an actuator (not shown) that provides movement thereof in the Z direction. The substrate support 108 is also coupled to a facilities cable 130 that is flexible which allows vertical movement of the substrate support 108 while maintaining communication with the second RF power source 128 as well as other power and fluid connections. The spacer 104 is disposed on the chamber body 106. A height of the spacer 104 allows movement of the substrate support 108 vertically within the processing region 118. The height of the spacer 104 is between about 0.5 inches and about 20 inches. In one example, the substrate support 108 is movable from a first distance 132A (shown in FIG. 1A) to a second distance 132B (shown in FIG. 1B) relative to the lid assembly 102. In one embodiment, the second distance 132B is about ⅔ of the first distance 132A. For example, the difference between the first distance 132A and the second distance is about 5 inches to about 6 inches.

The processing chamber 100 also includes a substrate transfer port 134. The substrate transfer port 134 is selectively sealed by a door 136. The door 136 facilitates vacuum sealing of the processing region 118. The door 136 also provides symmetrical RF application and/or plasma symmetry within the processing region 118. In one example, the door 136 is formed of a material that facilitates conductance of RF power, such as stainless steel, aluminum, or alloys thereof.

The spacer 104 includes a liner 138 that surrounds the processing region 118. In some embodiments, the spacer 104 and the liner 138 made of a single member. The liner 138 may be bonded (e.g., diffusion bonded) to the spacer 104.

The spacer 104 also includes a plurality of heater elements 140 embedded in or in thermal communication with the body of the spacer 104. The heater elements 140 are utilized to maintain the temperature of the spacer 104 at about 80 degrees Celsius, or greater. Each of the heater elements 140 may be cartridge heaters.

The liner 138 includes an interior surface 142 to be exposed to the processing region 118. In some embodiments, the interior surface 142 may include one or more materials including aluminum, titanium, or alloys thereof. The interior surface 142 of the liner 138 may be coated with one or more of the aluminum, titanium, or alloys thereof. In some embodiments, the interior surface 142 may include one or more ceramic containing materials. In one example, the liner 138 extends from the lid assembly 102, past the substrate support 108, and adjacent a bottom of the processing chamber 100. In such an example, the liner 138 may not contact the bottom of the processing chamber 100, but is instead spaced apart therefrom.

The spacer 104 also includes a magnet assembly 146. The magnet assembly 146 may include a plurality of magnets 148 disposed around the liner 138. The magnets 148 are coupled to an actuator (not shown) and rotated about a longitudinal axis 150 of the processing chamber 100. The magnets 148 may be adapted to be moved vertically (in the Z direction) along the longitudinal axis 150. Each of the magnets 148 may be permanent magnets, or electromagnets, or a combination thereof of any shape. In some embodiments, the plurality of magnets 148 is arranged in a circle about the spacer 104. The plurality of magnets 148 are arranged into two semi-circles. Each of the magnets 148 (indicated as 148a in FIGS. 2A and 2B) in a first semi-circle is oriented with the North pole facing the substrate support 108 (substantially parallel to the longitudinal axis 150). Each of the magnets 148 (indicated as 148b in FIGS. 2A and 2B) in a second semi-circle are oriented with the South pole facing the substrate support 108 (substantially parallel to the longitudinal axis 150).

The magnet assembly 146 aids in plasma confinement and/or tuning in the processing region 118. The magnet assembly 146 also forms a resonance cavity 170 within the processing region 118 during a deposition process. The resonance cavity 170 provides a magnetic flux that extends the plasma sheath vertically downward (Z direction) towards a substrate W.

The magnet assembly 146 provides a magnetic field in an X/Y plane as well as in the Z direction. The magnet assembly 146 also allows tuning of the plasma within the processing region 118 and/or the resonance cavity 170. Eddy currents in the plasma may be monitored to provide a metric for adjusting one or both of the position of the magnets 148 and the rotation speed of the magnets 148. Additionally or alternatively, metrology of films previously deposited on a substrate W may be performed, and the results utilized to vary positions and/or rotation speed of the magnets 148. Thus, the resonance cavity 170 and the magnet assembly 146 provide better film uniformity on a substrate.

Each of the magnets 148 are positioned within a cavity 152 formed in a sleeve 154 of the spacer 104. In one example, the magnets 148 are positioned below the heater elements 140. The materials and the thickness of the sleeve 154 provide for confinement of the magnetic fields generated by the magnets 148 to the processing region 118 by controlling the magnetic permeability of the sleeve 154. Confinement of the magnetic fields to the processing region 118 mitigates influence of the magnetic fields on nearby processing regions of adjacent process chambers, thus improving process uniformity. A controller 156 coupled to the processing chamber 100 and the magnet assembly 146 is configured to control aspects of the processing chamber 100 and magnet assembly 146 during processing.

The processing chamber 100 further includes a cathode assembly 158, which includes the substrate support 108. The cathode assembly 158 is coupled to an actuator 160 that moves the cathode assembly 158 vertically in the Z direction. The ability to adjust the position of the cathode assembly 158 for deposition processes allows an optimum film quality to be achieved.

The cathode assembly 158 also includes a facilities interface 162. The facilities interface 162 provides connections for RF power as well as other electrical and fluid connections. The facilities interface 162 is coupled to the substrate support 108 via the facilities cable 130. Other connections include a power source 164, a coolant source 166 and a gas supply 168. The power source 164 is utilized to power an electrostatic chuck 144 that is part of the substrate support 108. The power source 164 may be a DC power source. De-chucking is facilitated by the controller 156 that drains the electrostatic chuck 144. In addition, the facilities cable 130 is coupled to the second RF power source 128, optionally through a matching network, to facilitate operations within the processing chamber 100. In one example, the facilities cable 130 facilities transfer of RF power during PECVD process.

Figure 2A:
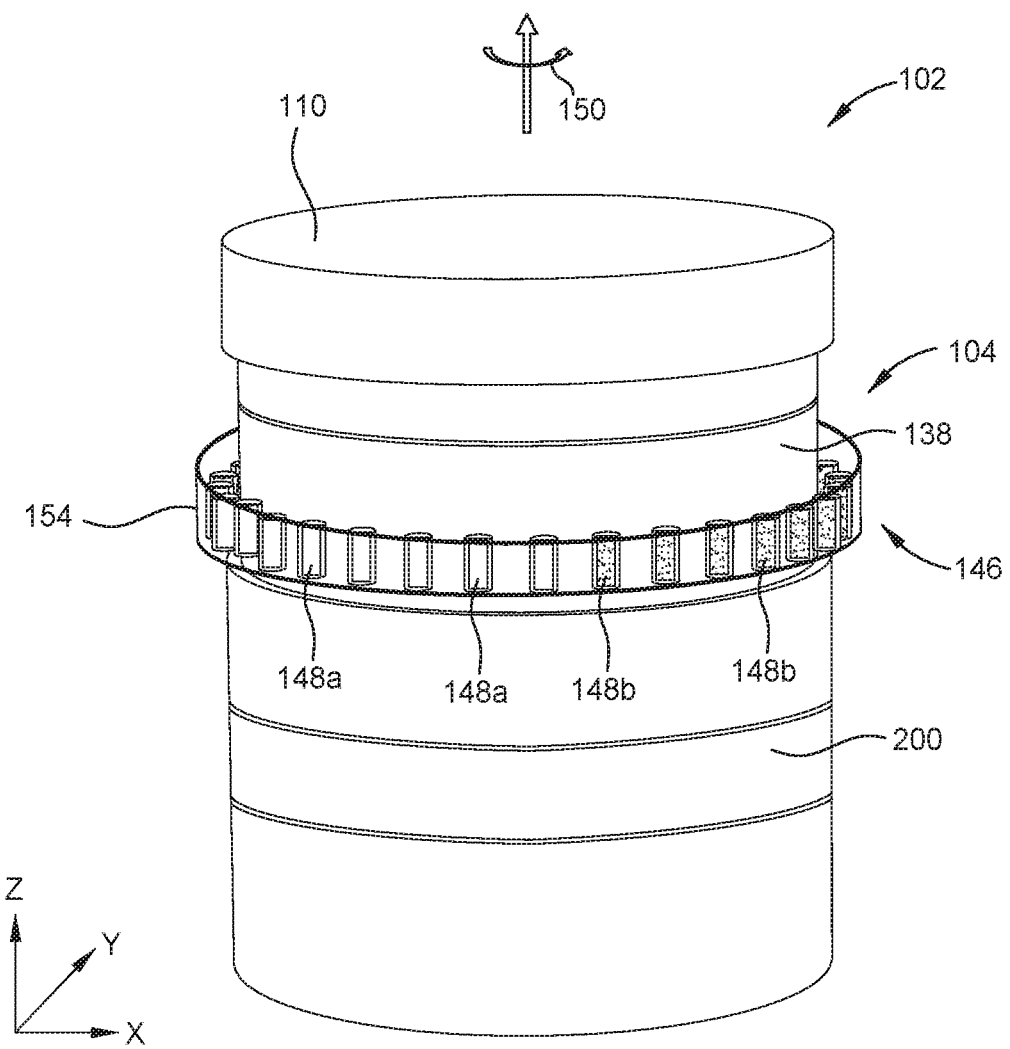
FIGS. 2A and 2B are an isometric view and a top view of a chamber body according to an embodiment.
Figure 2B:
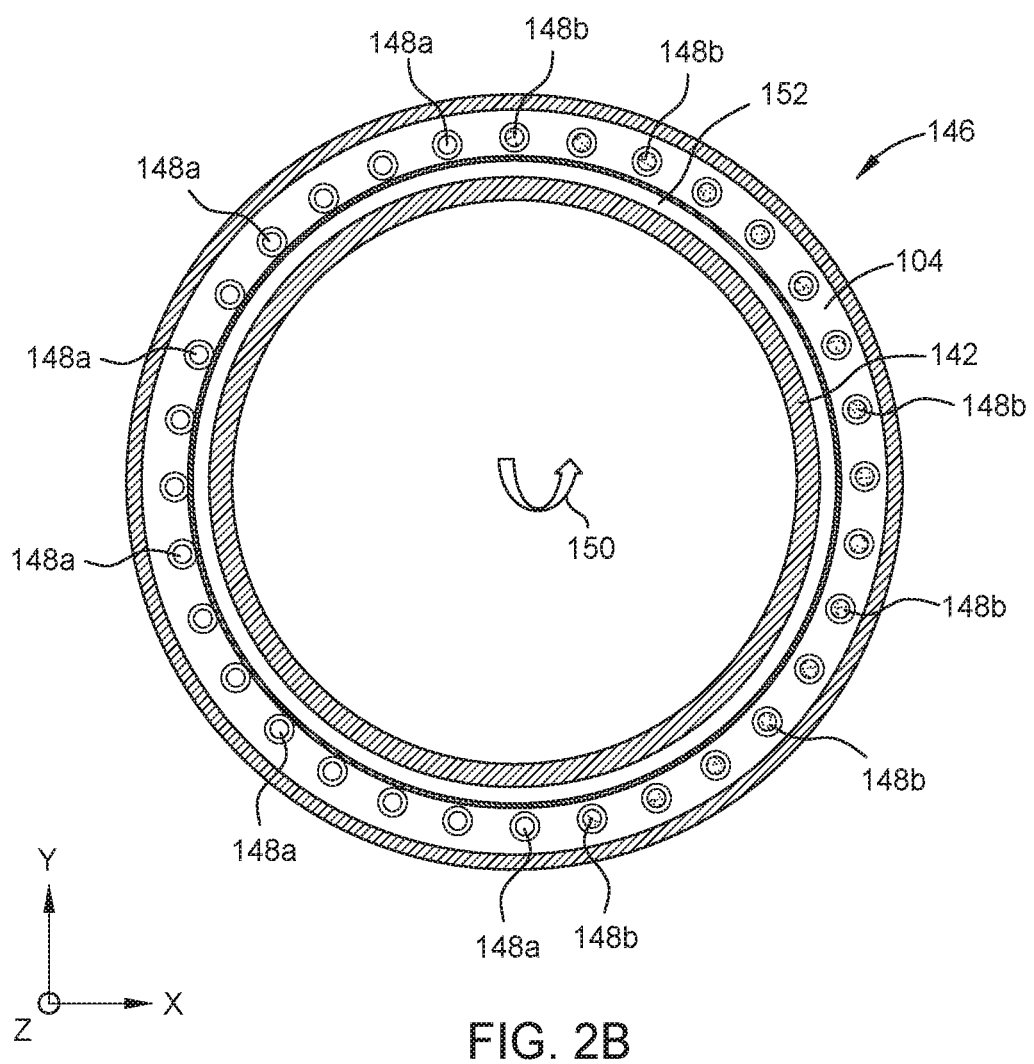

FIGS. 2A and 2B are an isometric view and a top view of the chamber body 106. In embodiments described herein, the spacer 104 includes a magnetic-material shield (referred to simply as "shield" hereinafter) 200 disposed around the liner 138, encapsulating the processing region 118 near the substrate support 108.

The shield 200 is formed of high permeability magnetic material having a relative permeability (i.e., relative permeability relative to free space) of 50,000 or more, such as between about 80,000 and about 100,000. The shield 200 not only attenuates magnetic field strength near the liner 138, thus preventing excessive deposition or etching on walls of the chamber body 106, but also provides additional tunability for the magnetic field profile (thus, the plasma density profile) in the processing region 118. The magnetic field profile in the processing region 118 may be adjusted by, for example, a location of the shield 200 relative to the processing region 118 as well as material, size, and/or shape of the shield 200.

Suitable high permeability magnetic materials that provides high sensitivity to the adjustment of the magnetic field profile in the processing region 118 include one or more of nickel, iron, copper, chromium, molybdenum, or silicon. Examples of such high permeability magnetic materials include nickel molybdenum alloy (e.g., HyMu 80®) and nickel-ion alloy (e.g., MuMETAL®).

The shield 200 may be of a cylindrical shape extending in the Z direction. In some embodiments, the shield 200 has a non-cylindrical shaped cross-section, such as a polygon shape. The shield 200 may have a length in the Z direction of between about 2 inches and about 10 inches. The shield 200 may be placed at a fixed position at a distance from the magnet assembly 146 including the plurality of magnets 148 in the Z direction. The position of the shield 200 may be fixed, or may be movable to provide further tunability for the plasma density profile in the processing region.

The shield 200 may be coated with a non-reactive material, such as aluminum, aluminum oxide, silicon dioxide, or polytetrafluoroethylene (PTFE), to prevent contamination by precursor gases or cleaning gasses in the processing chamber 100.

In the embodiments described herein, a magnetic-material shield that is disposed around a chamber body, encapsulating the processing region near a substrate support disposed within the chamber body is described. The use of a magnetic-material shield reduces the magnetic field near inner walls of the chamber body, and thus prevents excessive deposition or etching on the inner walls of the chamber body. The use of a magnetic-material shield attenuates the magnetic fields penetrating outside the chamber body, and thus prevents interaction with any adjacently placed chambers and ensures safety of users nearby. The ability of changing positions of the magnetic-material shield provides additional tunability of magnetic field profile, and plasma density profile, within the processing region.

While the foregoing is directed to embodiments of the present disclosure, other and further embodiments of the disclosure can be devised without departing from the basic scope thereof, and the scope thereof is determined by the claims that follow.

What is claimed is:

1. A plasma chamber, comprising:
   a chamber body having a processing region therewithin;
   a liner disposed on the chamber body, the liner surrounding the processing region;
   a substrate support disposed within the liner;
   a magnet assembly comprising a plurality of magnets disposed around the liner; and
   a magnetic-material shield disposed around the liner, the magnetic-material shield encapsulating the processing region near the substrate support;
   wherein the magnetic-material shield is of a cylindrical shape extending in a direction of a length of the chamber body and has a length of between 2 inches and 10 inches in the direction of the length of the chamber body;
   wherein the magnetic material shield is disposed at a distance from the magnet assembly in the direction of the length of the chamber body; and
   wherein the magnetic material shield is movable to provide further tunability for a plasma density profile in the processing region.

2. The plasma chamber of claim 1, wherein the magnetic-material shield comprises high permeability magnetic material having a relative permeability of 50,000 or more.

3. The plasma chamber of claim 2, wherein the high permeability magnetic material comprises nickel molybdenum alloy.

4. The plasma chamber of claim 1, further comprising:
a sleeve formed around the magnet assembly to confine magnetic fields generated the plurality of magnets to the processing region.

5. A shield for use in a plasma chamber, comprising:
a high permeability magnetic material having a relative permeability of 50,000 or more, wherein:
the high permeability magnetic material is configured to be positioned around a liner disposed within a chamber body of a plasma chamber;
the high permeability magnetic material is shaped cylindrical, extending in a direction of a length of the plasma chamber;
the high permeability magnetic material is configured to encapsulate a processing region of the plasma chamber; and
the high permeability magnetic material is configured to be movable relative to the processing region of the plasma chamber to provide further tunability for a plasma density profile in the processing region.

6. The shield of claim 5, wherein the high permeability magnetic material comprises nickel molybdenum alloy.

7. The shield of claim 5, wherein the high permeability magnetic material is shaped to have a length of between 2 inches and 10 inches in the direction of the length of the chamber body.

8. The plasma chamber of claim 5, wherein the high permeability magnetic material is positioned at a distance from a magnet assembly disposed around the liner in the direction of the length of the chamber body.

9. A process chamber, comprising:
a lid assembly;
a chamber body coupled to the lid assembly by a spacer, the spacer and the chamber body defining a processing region;
a rotatable magnet assembly coupled to the spacer outside of the processing region;
a substrate support disposed and movable within the processing region, wherein the substrate support is coupled to an actuator configured to raise and lower the substrate assembly; and
a magnetic-material shield disposed around the spacer, the magnetic-material shield encapsulating the processing region near the substrate support.

10. The process chamber of claim 9, wherein the lid assembly comprises a heat exchanger.

11. The process chamber of claim 9, wherein the spacer comprises a plurality of heater elements.

12. The process chamber of claim 9, wherein the spacer comprises a liner surrounding the processing region.

13. The process chamber of claim 9, wherein the rotatable magnet assembly comprises a plurality of magnets.

14. The process chamber of claim 9, wherein the magnetic-material shield comprises high permeability magnetic material having a relative permeability of 50,000 or more.

15. The process chamber of claim 9, wherein the magnetic-material shield has a length of between 2 inches and 10 inches in a direction of the length of the chamber body.

16. The process chamber of claim 9, wherein the magnetic-material shield is positioned at a distance from the rotatable magnet assembly in a direction of the length of the chamber body.

* * * * *